(12) United States Patent
Goo et al.

(10) Patent No.: US 8,013,375 B2
(45) Date of Patent: Sep. 6, 2011

(54) SEMICONDUCTOR MEMORY DEVICES INCLUDING DIAGONAL BIT LINES

(75) Inventors: Duo-Hoon Goo, Gyeonggi-do (KR);
Han-Ku Cho, Gyeonggi-do (KR);
Joo-Tac Moon, Gyeonggi-do (KR);
Sang-Gyun Woo, Gyeonggi-do (KR);
Gi-Sung Yeo, Seoul (KR); Kyoung-Yun Baek, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 127 days.

(21) Appl. No.: 12/465,234

(22) Filed: May 13, 2009

(65) Prior Publication Data
US 2009/0218610 A1 Sep. 3, 2009

Related U.S. Application Data

(62) Division of application No. 11/246,594, filed on Oct. 7, 2005, now Pat. No. 7,547,936.

(30) Foreign Application Priority Data

Oct. 8, 2004 (KR) .................................. 2004-80460

(51) Int. Cl.
*H01L 27/108* (2006.01)

(52) U.S. Cl. .. 257/296; 257/390; 257/506; 257/E27.084

(58) Field of Classification Search ................. 257/296, 257/305, 390, 506, E27.084
See application file for complete search history.

(56) References Cited

U.S. PATENT DOCUMENTS

| 5,391,901 A | 2/1995 | Tanabe |
| 5,519,239 A | 5/1996 | Chu |
| 5,604,365 A | 2/1997 | Kajigaya et al. |

(Continued)

FOREIGN PATENT DOCUMENTS

CN 1495906 A 5/2004

(Continued)

OTHER PUBLICATIONS

Korean Office Notice to File a Response/Amendment to Examination Report No. 9-5-2006-0240711163 date Apr. 27, 2006.

(Continued)

*Primary Examiner* — Tuan N. Quach
(74) *Attorney, Agent, or Firm* — Myers Bigel Sibley & Sajovec, P.A.

(57) ABSTRACT

A semiconductor memory device may include a semiconductor substrate having a plurality of active regions wherein each active region has a length in a direction of a first axis and a width in a direction of a second axis. The length may be greater than the width, and the plurality of active regions may be provided in a plurality of columns in the direction of the second axis. A plurality of wordline pairs may be provided on the substrate, with each wordline pair crossing active regions of a respective column of active regions defining a drain portion of each active region between wordlines of the respective wordline pair. A plurality of bitlines on the substrate may cross the plurality of wordline pairs, with each bitline being electrically coupled to a drain portion of a respective active region of each column, and with each bitline crossing drain portions of active regions of adjacent columns in different directions so that different portions of a same bitline are aligned in different directions on different active regions of adjacent columns.

19 Claims, 15 Drawing Sheets

U.S. PATENT DOCUMENTS

| | | |
|---|---|---|
| 5,734,184 A | 3/1998 | Andoh et al. |
| 5,825,688 A * | 10/1998 | Ueki .................... 365/185.11 |
| 6,151,243 A | 11/2000 | Kim |
| 6,291,846 B1 | 9/2001 | Ema et al. |
| 6,400,596 B2 | 6/2002 | Takemura et al. |
| 6,671,198 B2 | 12/2003 | Takemura et al. |
| 6,747,304 B2 | 6/2004 | Lee et al. |
| 6,861,698 B2 | 3/2005 | Wang |
| 6,982,447 B2 | 1/2006 | Kim |
| 7,288,812 B2 * | 10/2007 | Riedel ........................ 257/316 |
| 2001/0002702 A1 | 6/2001 | Takemura et al. |
| 2002/0130345 A1 | 9/2002 | Saigoh et al. |
| 2002/0172070 A1 | 11/2002 | Arimoto et al. |
| 2004/0061145 A1 | 4/2004 | Lee et al. |
| 2004/0125636 A1 | 7/2004 | Kurjanowicz et al. |
| 2004/0141361 A1 | 7/2004 | Tsukikawa et al. |
| 2005/0121710 A1 | 6/2005 | Shino |
| 2005/0173743 A1 | 8/2005 | Sim et al. |

FOREIGN PATENT DOCUMENTS

| | | |
|---|---|---|
| JP | 05-235298 | 9/1993 |
| JP | 09-283718 | 10/1997 |
| JP | 11-186517 | 7/1999 |
| JP | 2003-273245 | 9/2003 |
| JP | 2004-274048 | 9/2004 |
| KR | 10-1996-068833 | 12/1996 |
| KR | 10-1997-0018577 | 4/1997 |
| KR | 10-1997-0018583 | 4/1997 |
| KR | 1997-18583 | 4/1997 |
| KR | 1998-050069 | 9/1998 |
| KR | 1020000027376 | 5/2000 |
| KR | 10-0291182 | 7/2001 |
| KR | 10-2002-7005277 | 4/2002 |
| KR | 2002-0084062 | 11/2002 |
| KR | 1020040055483 | 6/2004 |
| KR | 1020040060410 | 7/2004 |
| WO | WO 0141211 | 6/2001 |

OTHER PUBLICATIONS

Translation of an Office Action issued by the German Patent Office, dated Dec. 14, 2006.

* cited by examiner

000
SEMICONDUCTOR MEMORY DEVICES INCLUDING DIAGONAL BIT LINES

RELATED APPLICATION

This application claims the benefit of priority as a divisional of U.S. application Ser. No. 11/246,594, filed Oct. 7, 2005, now U.S. Pat. No. 7,547,936, which claims the benefit of priority from Korean Patent Application No. 2004-80460, filed on Oct. 8, 2004, in the Korean Intellectual Property Office. The disclosures of the above referenced U.S. and Korean patent applications are hereby incorporated herein in their entirety by reference.

FIELD OF THE INVENTION

The present invention relates to electronics and more particularly to semiconductor memory devices.

BACKGROUND

In a cell array of a conventional semiconductor memory device, a memory cell may include a switching element and a data storage element, and a cell may have an 8F2 configuration (F being a feature size based on a design rule). Many efforts have been made to provide increased integration of devices. More particularly, an area occupied by a memory cell has been reduced. For example, semiconductor memory devices are changing from 8F2 configurations to 6F2 configurations. Active regions of a 6F2-type cell array recently developed may be diagonal.

Portions of a conventional cell array having diagonal active regions is illustrated in FIG. 1 and FIG. 2. The conventional cell array has a plurality of diagonal active regions. Adjacent active regions are arranged face to face in a major axis direction. To define diagonal shapes on a reticle, a to-be-exposed portion is divided into segments S and S' of a predetermined width which are exposed discontinuously. Therefore, more time may be required to fabricate a reticle than a square configuration having vertical and horizontal axis directions. Further, a segment size may be determined according to pattern-to-pattern distances B and B' and a pattern inclination so that correcting patterns may be difficult. If patterns are disposed face to face in a major direction, a bridge may occur at patterns transcribed to a substrate if a distance between adjacent patterns is a feature size A. In the case where patterns are diagonally disposed face to face, as illustrated in FIG. 2, a pattern-to-pattern distance A' may become narrower than a feature size increasing a possibility that a bridge may occur.

To form a normal pattern during an exposure process, an optical requirement for a light source of a direction corresponding to an inclined axis of a pattern may be provided. Thus, an optical system may adopt a unique aperture to select and irradiate light in the direction corresponding to a pattern axis.

SUMMARY

According to some embodiments of the present invention, a semiconductor memory device may include a substrate having a plurality of active regions, and a field isolation layer on the substrate surrounding the active regions of the semiconductor substrate. More particularly, each of the plurality of active regions may have a length in a direction of a first axis and a width in a direction of a second axis, and the length may be greater than the width. Moreover, the plurality of active regions may be provided in a plurality of columns of active regions in the direction of the second axis, and active regions of adjacent columns may be offset in the direction of the second axis.

According to some additional embodiments of the present invention, a semiconductor memory device may include a substrate having a plurality of active regions, a plurality of wordline pairs on the substrate, and a plurality of bitlines on the substrate crossing the plurality of wordline pairs. Each active region may have a length in a direction of a first axis and a width in a direction of a second axis, and the length may be greater than the width. Moreover, the plurality of active regions may be provided in a plurality of columns of active regions in the direction of the second axis. Each wordline pair may cross active regions of a respective column of active regions defining a drain portion of each active region between wordlines of the respective wordline pair. Each bitline may be electrically coupled to a respective drain portion of an active region of each column, and each bitline may be arranged between the respective drain portion and another drain portion of an adjacent active region.

According to some more embodiments of the present invention, a semiconductor memory device may include a semiconductor substrate having a plurality of active regions, a plurality of wordline pairs on the subtrate, and a plurality of bitlines on the substrate crossing the plurality of wordline pairs. Each active region may have a length in a direction of a first axis and a width in a direction of a second axis, and the length may be greater than the width. Moreover, the plurality of active regions may be provided in a plurality of columns in the direction of the second axis. Each wordline pair may cross active regions of a respective column of active regions defining a drain portion of each active region between wordlines of the respective wordline pair. Each bitline may be electrically coupled to a drain portion of a respective active region of each column, and each bitline may cross drain portions of active regions of adjacent columns in different directions.

According to still more embodiments of the present invention, a semiconductor memory device may include a semiconductor substrate having an active region, a field isolation layer on the semiconductor substrate surrounding the active region, first and second wordlines on the substrate and crossing the active region, and first and second memory storage elements. More particularly, the active region may have a length and a width with the length being greater than the width. The first and second wordlines may define a drain portion of the active region between the first and second wordlines, and first and second source portions of the active region at opposite ends of the active region. The first and second memory storage elements may be respectively coupled to the first and second source portions of the active region, and the first and second wordlines may be between portions of the respective first and second memory storage elements and the substrate in a direction perpendicular to the substrate.

According to some embodiments of the present invention, a cell array may include active regions having horizontal and vertical direction axes. In addition a cell array may include a pattern that is readily designed and optically stable. To achieve these features, a semiconductor memory device may be provided having a cell array including bar-shaped active regions each having a major axis and a minor axis.

According to some embodiments of the present invention, a semiconductor memory device may include bar-shaped first and second active regions having a major axis and a minor axis. The first active regions and the second active regions may be arranged in a minor axis direction to be regularly spaced apart from one another. The second active regions may be arranged in a major axis direction to be regularly spaced apart from the first active regions and may be arranged in the minor axis direction to be ½ pitch spaced from the first active regions.

The first and second active regions may be regularly spaced from adjacent active regions in the respective directions as long as a feature size, respectively. When the first and second active regions are each five times longer than the feature size in a major axis direction, the memory cell may have a 6F2 configuration.

The semiconductor memory device may further include a wordline pair crossing over the first or second active regions. The wordline pair may divide an underlying active region into three segments. In a major axis direction, a length of the segment may be equal to a feature size.

The semiconductor memory device may also include a plurality of bitlines alternately connected to the first active region and the second active region. One of the bitlines may be alternately connected to a plurality of first active regions and a plurality of second active regions that are arranged in one direction to be ½ pitch spaced from the first active regions. More particularly, the bitline may be disposed between a pair of adjacent first active regions and between a pair of second active regions arranged in one direction to be ½ pitch spaced apart from the first active region. Alternatively, the bitlines may be arranged in a zigzag pattern to diagonally cross over the first active region in one direction and to diagonally cross over the second active region in another direction.

If a bitline is disposed between the first active regions and between the second active regions that are ½ pitch spaced from the first active regions, the bitline may be connected to a divided active region between wordlines providing a wordline pair and may extend one direction to be connected to the first and second active regions through the drain pad laid over the bitline.

The semiconductor memory device may further include a data storage element connected to respective divided active regions at opposite sides of the wordline pair. The data storage element may be a capacitor and/or a resistance element. With a ferroelectric memory device or a DRAM device, for example, the data storage element may be a capacitor. With a phase transition memory device or a magnetic tunneling junction (MJT) device, the data storage element may be a resistance element. The data storage element may be connected to the first or second active regions through a source pad connected to respective first and second active regions and a buffer electrode between the source pad and data storage element. The buffer electrode may be partially laid over the wordline. The data storage element may be laid over the source pad and may extend in one direction to be laid over the wordline. Alternatively, the data storage element may have a sidewall laid over the wordline and an opposite sidewall laid over the first or second active region. The data storage elements may be spaced from one another in a minor axis direction of the active region as long as a feature size.

According to some additional embodiments of the present invention, a method may be provided for fabricating a semiconductor device including a cell array having bar-shaped active regions each having a major axis and a minor axis. A device isolation layer may be formed at a semiconductor substrate to define bar-shaped first and second active regions each having a major axis and a minor axis. The first active regions and the second active regions may be arranged in a minor axis direction to be regularly spaced from one another. The second active regions may be regularly spaced from the first active regions in a major axis direction and may be ½ pitch spaced from the first active regions in a minor axis direction.

A plurality of wordline pairs may be formed to cross over the first or second active regions and to divide an underlying active region into three segments. A plurality of bitlines may be formed to be alternately connected to the first active regions and the second active regions. A plurality of data storage elements may be formed to be connected to divided active regions at opposite sides of the wordline pair, respectively.

A first interlayer dielectric may be formed on an entire surface of a substrate where the wordline pair is formed, and a drain pad and a source pad may be formed. The drain pad may be connected to a divided active region between the wordlines providing the wordline pair through the first interlayer dielectric, and the source pad may be connected to respective divided active regions at opposite sides of the wordline pair.

The drain pad may extend in one direction to be laid over the device isolation layer. A second interlayer dielectric may be formed on an entire surface of a substrate where the drain and the source pad are formed. The bitline may be disposed between adjacent first active regions and between a pair of second active regions that are ½ pitch spaced from the first active regions and may be connected to the drain pad through the second interlayer dielectric. A third interlayer dielectric may be formed on an entire surface of a substrate where the bitline is formed. A data storage element may be formed to be connected to the source pad through the third interlayer dielectric and the second interlayer dielectric.

In addition, the bitline may be disposed to diagonally cross over the first active region in one direction and to diagonally cross over the second active region in another direction. A third interlayer dielectric may be formed on an entire surface of a semiconductor substrate where the bitline is formed. A data storage element may be formed to be connected to the source pad through the third interlayer dielectric and the second interlayer dielectric.

DETAILED DESCRIPTION

Figure 1:
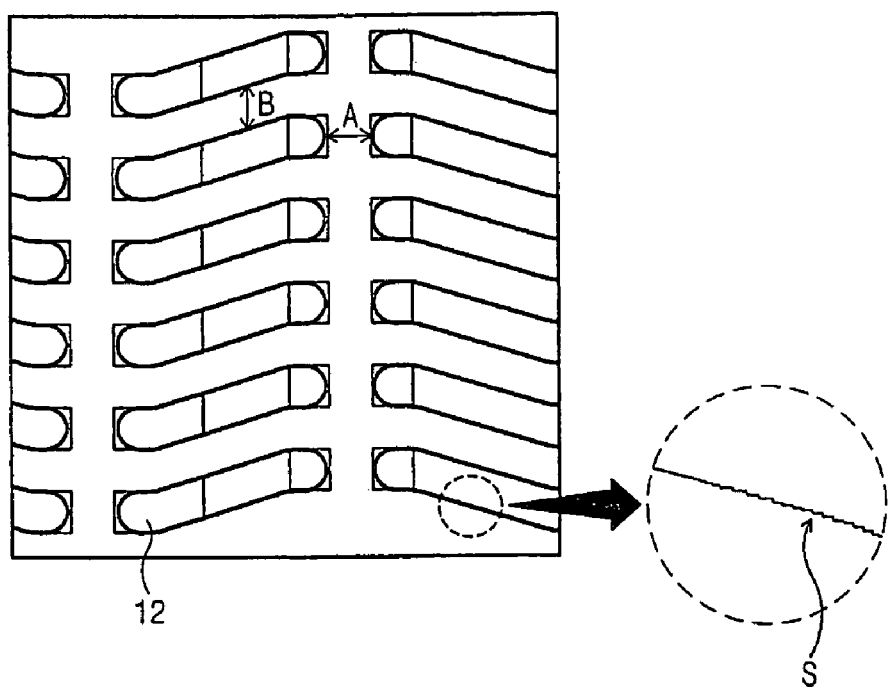
FIG. 1 and FIG. 2 are top plan views of conventional DRAM cells.
Figure 2:
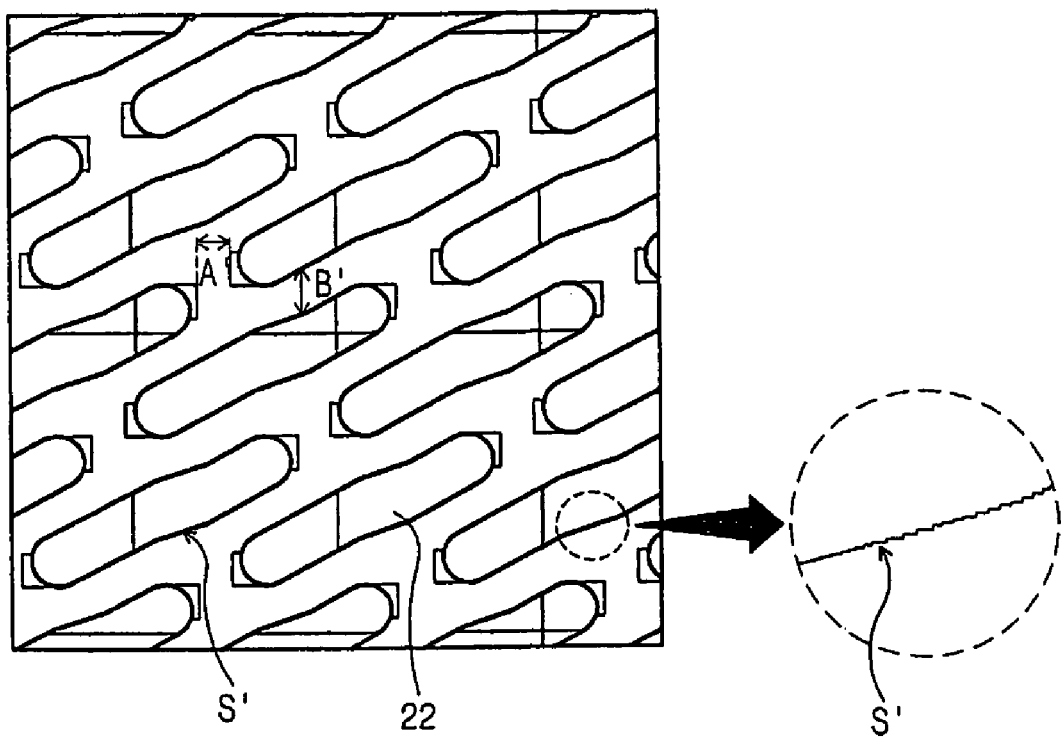

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like numbers refer to like elements throughout.

It will be understood that when an element is referred to as being "coupled", "connected", "responsive" or "in response to" another element, it can be directly coupled, connected, responsive or in response to the other element or intervening elements may be present. In contrast, the term "directly" means there are no intervening elements present. As used herein, the term "and/or" includes any and all combinations of one or more of the associated listed items and may be abbreviated as "/".

It also will be understood that, as used herein, the terms "row" or "horizontal" and "column" or "vertical" indicate two relative non-parallel directions that may be orthogonal to one another. However, these terms do not require an absolute horizontal or vertical orientation as shown in the figures.

It will be understood that, although the terms first, second, etc. may be used herein to describe various elements, these elements should not be limited by these terms. These terms are only used to distinguish one element from another. For example, a first line could be termed a second line, and, similarly, a second line could be termed a first line without departing from the teachings of the disclosure.

Spatially relative terms, such as "beneath", "below", "lower", "above", "upper", "over" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention. It will be understood, for example, that a rectangular feature may have rounded corners.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
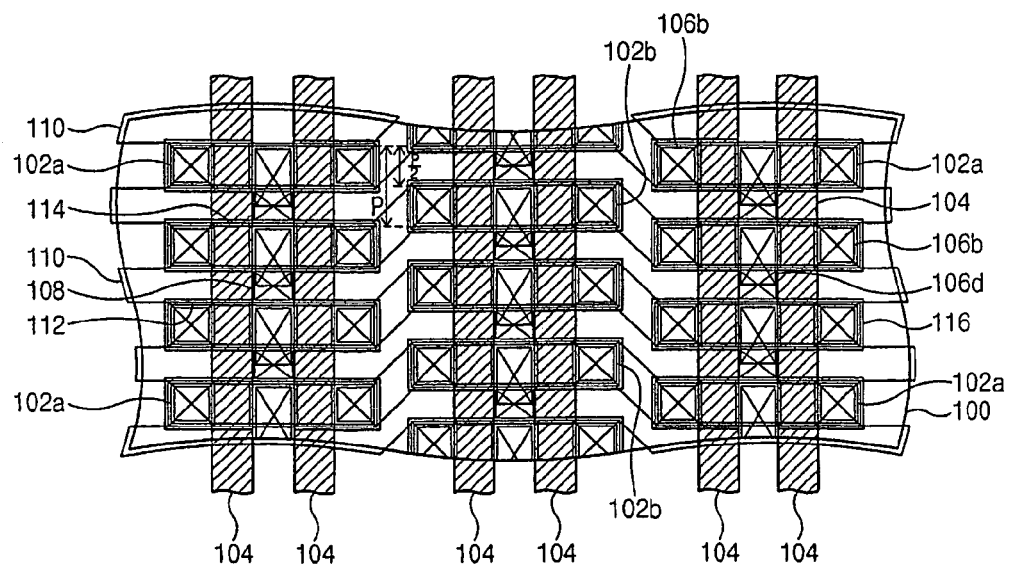
FIG. 3 and FIG. 4 are top plan views of semiconductor memory device arrays according to some embodiments of the present invention.
Figure 4:
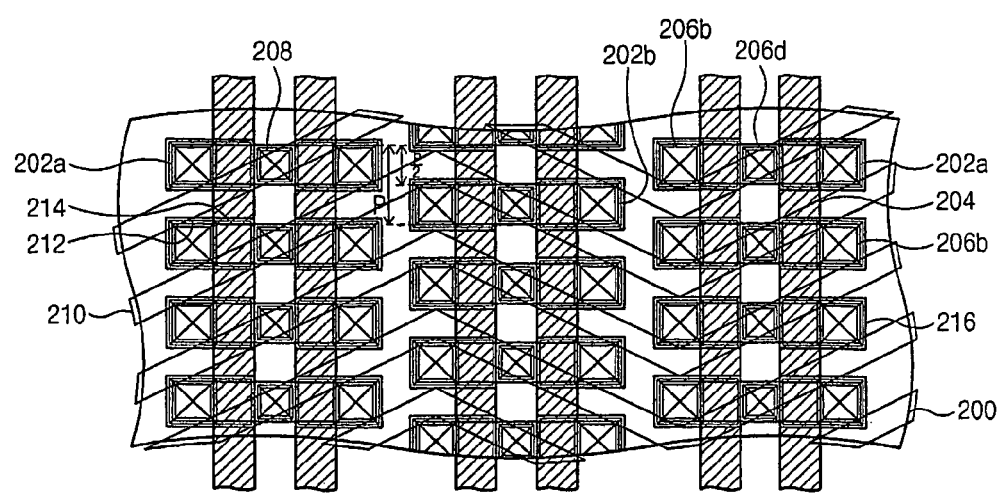

FIG. 3 and FIG. 4 are top plan views of semiconductor memory cell arrays according to first and second embodiments of the present invention, respectively.

As illustrated in FIG. 3, a semiconductor memory device according to first embodiments of the present invention may include bar-shaped first and second active regions 102a and 102b, each having a major axis and a minor axis. A major axis of an active region may be a horizontal (or vertical) axis of a substrate, and a minor axis thereof may be a vertical (or horizontal) axis of the substrate. The major axis and the minor axis may be perpendicular with respect to each other. The first active regions 102a may be arranged in columns in a direction of a minor axis to be regularly spaced apart from one another, and the second active regions 102b may also be arranged in columns in the direction of the minor axis to be regularly spaced apart from one another. Columns of the second active regions 120b may be regularly spaced from adjacent columns of the first active regions 102a in a direction of a major axis and may be ½ pitch spaced from the first active regions 102a in the minor axis direction. In other words, active regions 102a may be offset relative to active regions 102b by a distance equal to a width of an active region. A cell array may include columns arranged alternately, with a first column including first active regions 102a and with a second column including second active regions 102b. The first active regions 102a may have the same shape as the second active regions 102b. In a major axis direction, the first and second active regions 102a and 102b may each be about five times longer than a feature size (e.g., a width of an active region). Each of the active regions may be spaced from adjacent active regions in the major and/or minor axis directions by a distance as long as the feature size (e.g., a width of an active region).

Pairs of wordlines 104 (wordline pairs) may cross over the first active regions 102a and/or the second active regions 102b. The wordlines 104 may have a feature size (e.g., a width equal to a width of an active region). Each of the first active regions 102a and/or the second active regions 102b is divided into three segments by a respective wordline pair. In an active region, a drain pad 106d is connected to a central portion of the active region between the wordlines of the respective wordline pair. A pair of source pads 106b may be connected to respective ends of each active region so that each source pad 106b of an active region is separated from the drain pad of the active region by a respective wordline. The drain pad 106d extends from an upper portion of the active region over a portion of an area between the active regions (i.e., over a portion of a device isolation area). Bitlines 110 may cross over the wordlines 104. Each bitline 110 may be alternately connected to first and second active regions 102a and 102b through respective drain pads 106d. The bitline 110 passes between a pair of first active regions 102a, which are ½ pitch spaced from the second active regions 102b in one direction, and between a pair of second active regions 102b. Because the drain pad 106d extends from the active region to a device isolation area, it may be connected to an overlying bitline 110. Each bitline 110 may have a feature size (e.g., a width equal to a width of an active region) and may be spaced from an adjacent bitline by a distance as long as the feature size. The bitline 110 may be connected to the drain pad 106d through a bitline plug 108. The bitline plug 108 and the bitline 110 may be unified.

Data storage elements 116 may be connected to respective source pads at opposite ends of each active region. With a DRAM (Dynamic Random Access Memory), the data storage element may be a cylindrical capacitor, a box-type capacitor and/or an MIM (Metal Insulator Metal) capacitor. With a ferroelectric memory device, the data storage element may be a ferroelectric capacitor. With a phase transition memory device, the data storage element may be a phase transition resistance memory element. With a magnetic memory device, the data storage element may be an MJT (Magnetic Tunnel Junction) resistance element.

A data storage element 116 may be connected to an active region through a respective source pad 106b. A buffer electrode 114 may be further formed between each source pad 106b and the (respective) data storage element 116. The buffer electrode 114 may be provided over the source pad 106b and may be provided partially overlapping the respective wordline. A buffer electrode 114 may be structurally disposed toward the center of an active region to widen a space between data storage elements 116 connected to adjacent active regions. A buffer electrode 114 may be connected to a respective source pad 106b through a storage plug 112, so that the data storage element 116 is connected to the active region through the buffer electrode 114 and the source pad 106b.

Although not shown in FIG. 3, the storage plug 112 may be in direct contact with the data storage element 116. In this case, the buffer electrode 114 may be omitted.

Further, the data storage element 116 may be partially laid over the source pad 106b so as to widen a space between data storage elements formed on adjacent active regions. That is, the data storage element 116 may have a sidewall laid over a portion of the adjacent wordline and an opposite sidewall may be laid over the active region.

As illustrated in FIG. 4, active regions of a semiconductor memory device according to second embodiments of the present invention may have a same arrangement as those of the semiconductor memory device of FIG. 3. The memory device may further include first active regions 202a and second active regions 202b. Each of the first and second active regions 202a and 202b may be bar-shaped (e.g., rectangular) and may have a major axis and a minor axis. The first active regions 202a may be arranged in a direction of the minor axis to be regularly spaced apart from one another. The second active regions 202b may be arranged in a direction of the minor axis to be regularly spaced apart from one another. The second active regions 202b may be arranged in the major axis to be regularly spaced from the first active regions 202a. The second active regions 202b may be arranged in the direction of the major axis to be ½ pitch spaced from the first active regions 202a, respectively. In other words, active regions 202a may be offset relative to active regions 102b by a distance equal to a width of an active region.

A cell array includes columns and rows which may be alternately arranged. Each of the rows may include the first active regions 202a, and each of the columns may include the second active regions 202b. The first and second active regions 202a and 202b may have the same shape. In the major axis direction, the first and second active regions 202a and 202b may each be five times longer than a feature size (e.g., a width). Each of the active regions may be spaced apart from adjacent active regions in the major and/or minor axis by a distance about as long as the feature size.

Pairs of wordlines 204 (wordline pairs) cross over the first active regions 202a and the second active regions 202b. Each of the wordlines 204 has a feature size (e.g., a width equal to a width of an active region). A wordline pair divides a respective active region 202a or 202b into three segments. A drain pad 206d is connected to a portion of an active region between wordlines of the respective wordline pair. Source pads 206b are connected to respective ends of an active region at opposite sides of the respective wordline pair. Bitlines 210 cross over the wordlines 204. The bitline 210 may be alternately connected to first active regions 202a and second active regions 202b. The bitlines 210 may be connected to respective first and second active regions 202a and 202b through drain pad 206d.

Each bitline 210 diagonally crosses the first active regions 202a in one direction and diagonally crosses the second active region 202b in another direction. That is, the bitlines 210 have a zigzag shape. Unlike the structure of FIG. 3, the drain pad 206d may be provided only over the active region. In FIG. 4, the bitline 210 may have a feature size (e.g., a width equal to a width of an active region) and may be spaced from an adjacent bitline by a distance about as long as the feature size. A bitline 210 may be connected to a respective drain pad 206d through a respective bitline plug 208. In a alternative, the bitline plugs 208 and the respective bitlines may be unified.

Data storage elements 216 may be connected to opposite ends of active regions at opposite sides of respective wordline pairs. With a DRAM, the data storage element 216 may be a cylindrical capacitor, a box-type capacitor, and/or an MIM capacitor. With a ferroelectric memory device, the data storage element 216 may be a ferroelectric capacitor. With a phase transition memory device, the data storage element 216 may be a phase transition resistance element. With a magnetic memory device, the data storage element 216 may be an MJT resistance element.

Each data storage element 216 may be connected to a respective active region through a respective source pad 206b. A buffer electrode 214 may be further formed between the source pad 206b and the data storage element 216. The buffer electrode 214 may be provided over the source pad 206b and provided partially over the adjacent wordline. A buffer electrode 214 may be structurally provided toward the center of an active region to widen a space between data storage elements 216 connected to adjacent active regions. The buffer electrodes 214 may be connected to respective source pads 206b through storage plugs 212, so that the data storage elements 216 are connected to the active regions through the buffer electrodes 214 and the source pads 206b.

Although not shown in FIG. 4, the storage plugs 212 may be in direct contact with the respective data storage elements 216. In this case, the buffer electrodes 214 may be omitted.

Further, the data storage elements 216 may be provided partially over respective source pads 206b to widen a space between data storage elements formed on adjacent active regions. That is, each data storage element 216 may have a sidewall over the wordline and an opposite sidewall over the active region.

FIG. 5 through FIG. 9, FIG. 10A, FIG. 10B, and FIG. 10C are top plan views illustrating steps of fabricating a semiconductor memory device according to first embodiments of the present invention.

Figure 5:
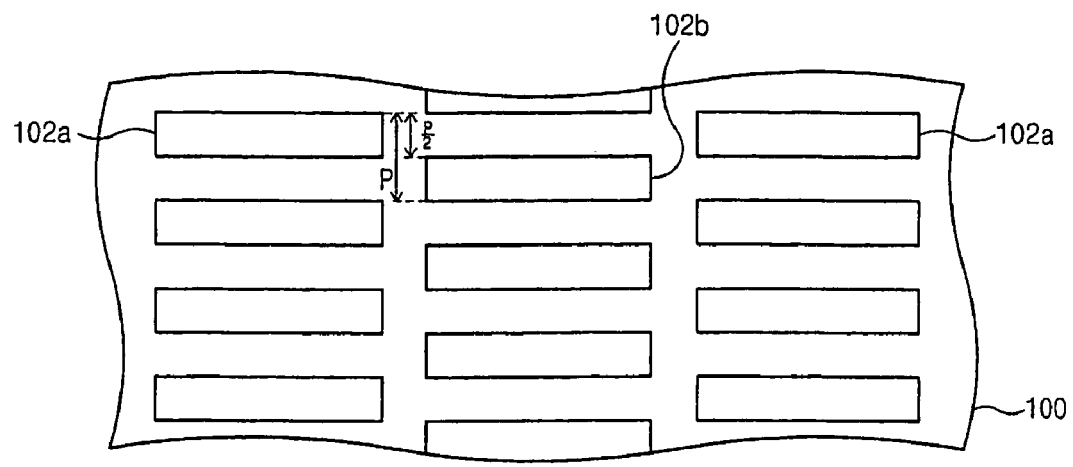
FIG. 5 through FIG. 9, FIG. 10A, FIG. 10B, and FIG. 10C are top plan views illustrating steps of fabricating a semiconductor memory device according to first embodiments of the present invention.

As illustrated in FIG. 5, device isolation layers are formed on a semiconductor substrate 100 to define first active regions 102a and second active regions 102b. The first and second active regions 102a and 102b are bar-shaped (e.g., rectangular) to define a major axis (in a length direction) and a minor axis (in a width direction). In a minor axis direction, the first active regions 102a and the second active regions 102b are regularly spaced apart from one another by a distance of about P/2 (e.g. a width of an active region). Columns of first and second active regions are alternately arranged in a cell array. The first active regions 102a are spaced apart from one another by a distance of about P/2 as long as a feature size (e.g., a width of an active region). The second active regions 102b are also spaced apart from one another by a distance of about P/2 as long as the feature size (e.g., width of an active region). The first active regions 102a and the second active regions 102b have a feature size (e.g., width) in the direction of the minor axis. The second active regions 102b are arranged in the direction of the the minor axis to be ½ pitch spaced from the first active regions 102a. In other words, the first and second active regions 102a and 102b are offset in the minor axis direction by a distance of about P/2. The first and second active regions 102a and 102b may have a same shape, such as a rectangular shape. In a major axis direction, the first active regions 102a and the second active regions 102b may be five times longer than a feature size (e.g., width) thereof. The first active regions 102a and the second active regions 102b may have a feature size (e.g., width) in a minor axis direction.

Figure 6:
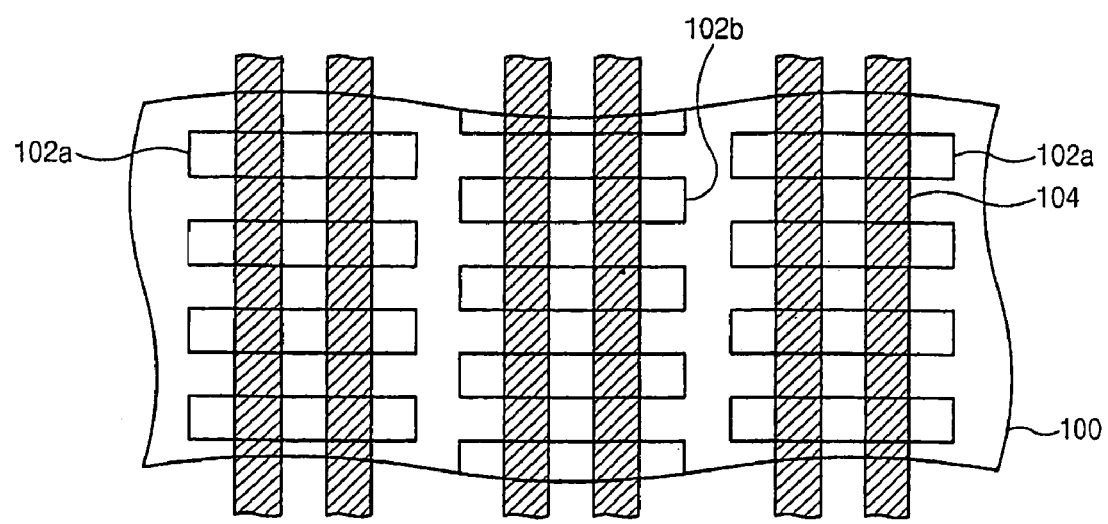

As illustrated in FIG. 6, wordlines 104 may be formed with respective pairs of the wordlines 104 crossing over respective first active regions 102a or respective second active regions 102b. In other words, each wordline pair crosses over a respective column of active regions 102a or 102b. Therefore, each active region 102a or 102b is divided into three segments by the respective wordline pair. Each wordline 104 has a feature size (e.g., width) and each active region segment (defined by the respective wordline pair) has a feature size in a direction of the major axis.

Figure 7:
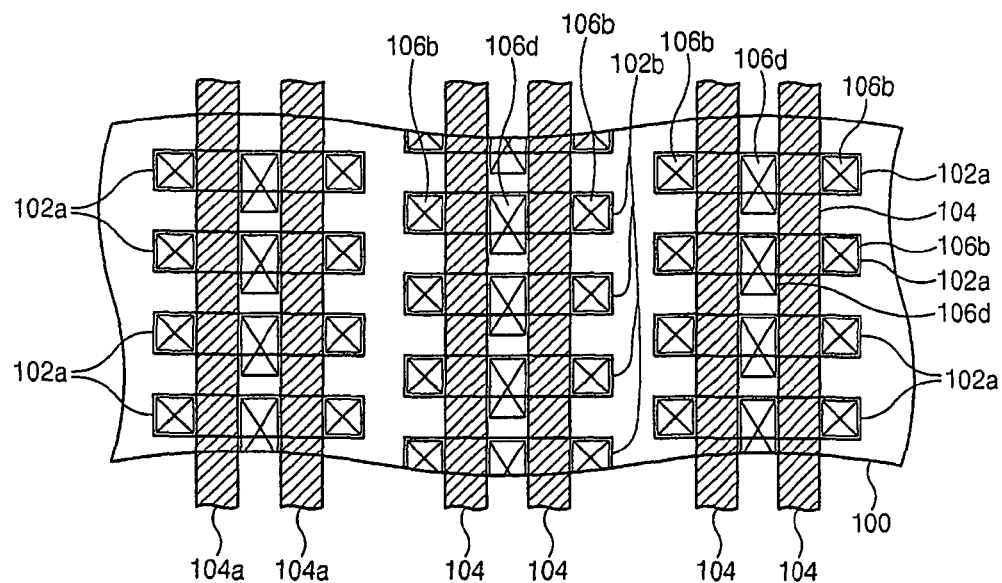

As illustrated in FIG. 7, a drain pad 106d is formed on a central portion of each active region between the two wordlines 104 of the respective wordline pair. A source pad 106b is formed at each end of each active region on opposite sides of the respective wordline pair. The drain pad 106d of an active region extends from the central portion of the active region in one direction over a portion of the device isolation layer. A first interlayer dielectric may be formed to cover the drain pads 106d and the source pads 106b. The first interlayer dielectric may be formed using a self-aligned contact (SAC) process.

Figure 8:
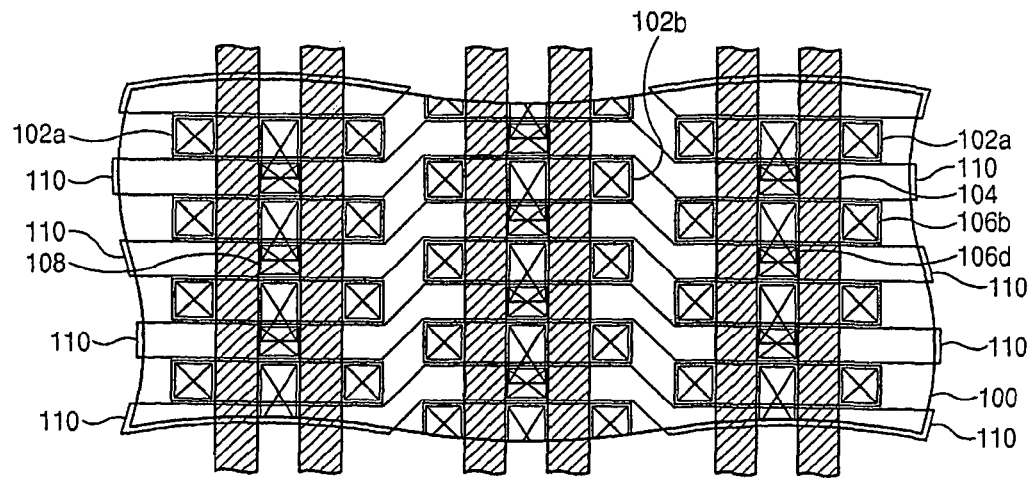

As illustrated in FIG. 8, bitlines 110 may be formed crossing over the wordlines 104. The bitlines 110 may be alternately connected to first and second active regions 102a and 102b. The bitlines 110 may pass between adjacent second active regions 102b (which are ½ pitch spaced from the first active regions 102a in one direction) and between adjacent first active region 102a. Each bitline 110 may be connected to respective drain pads 106d through respective bitline plugs 108. A second interlayer dielectric may thus be formed on an entire surface of a substrate including the source pads 106b and the drain pads 106d, and bitline plugs 108 may be formed connected to the drain pads 106d through the second interlayer dielectric. Bitlines may then be formed connected to the bitline plugs 108. Alternatively, contact holes may be formed using a dual damascene process to expose the drain pads 106d simultaneously with formation of bitline grooves, and then, the contact holes and the bitline grooves may be filled with a conductive layer, so that each bitline is in direct contact with respective drain pads.

Figure 9:
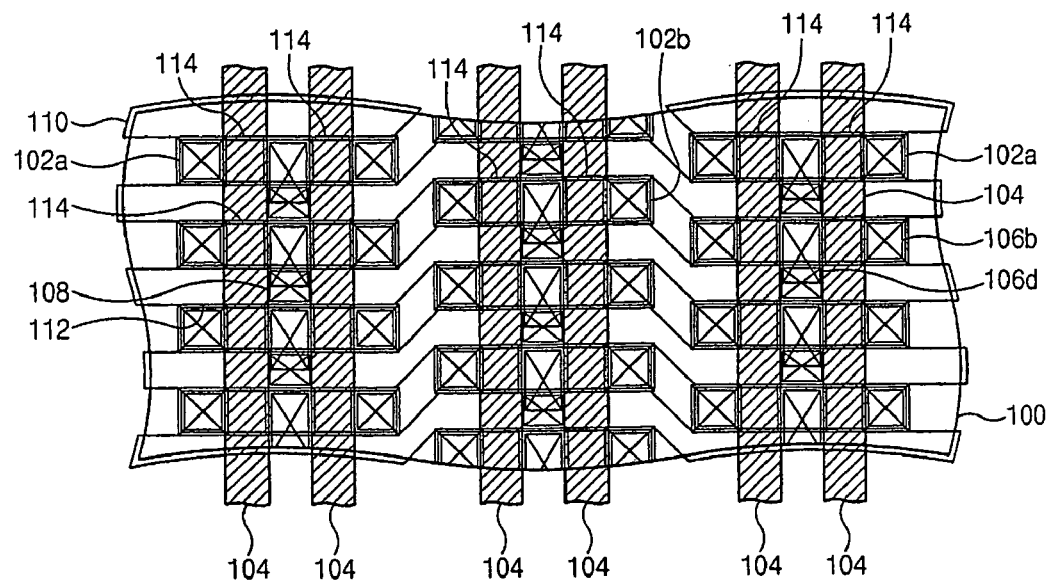

As illustrated in FIG. 9, buffer electrodes 114 may be formed connected to respective source pads 106b through respective storage plugs 112. The buffer electrodes 114 may serve to secure space between data storage elements connected to first active regions and data storage elements connected to second active regions and to increase an area occupied by each data storage element.

A third interlayer dielectric may be formed on the substrate including the bitlines 110. Storage plugs 112 may be formed connected to respective source pads 106b through the third interlayer dielectric and the second interlayer dielectric. The buffer electrodes 114 may be formed on respective storage plug 112, and each buffer electrode 114 may extend across a portion of the third interlayer dielectric opposite the adjacent word line.

Figure 10A:
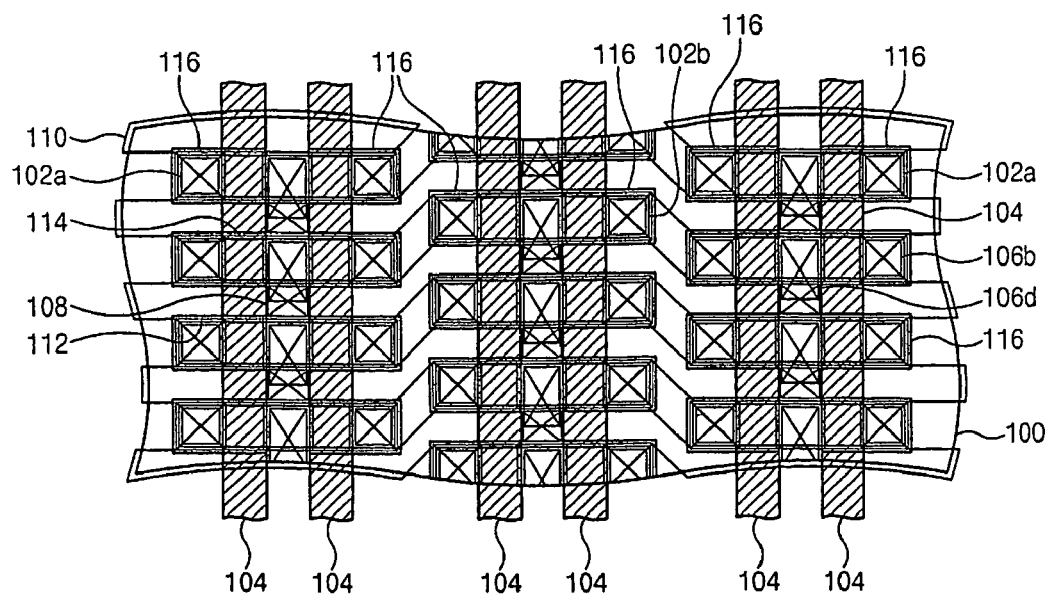

As illustrated in FIG. 10A, a data storage element 116 may be formed on each of the buffer electrodes 114. Portions of a data storage element 116 may extend over the adjacent wordline to increase an area occupied by the data storage element. The data storage element 116 may be a capacitor or a resistance element according to the type of semiconductor memory device being fabricated. A method of forming the data storage element 116 may vary with the type of memory device being fabricated.

Figure 10B:
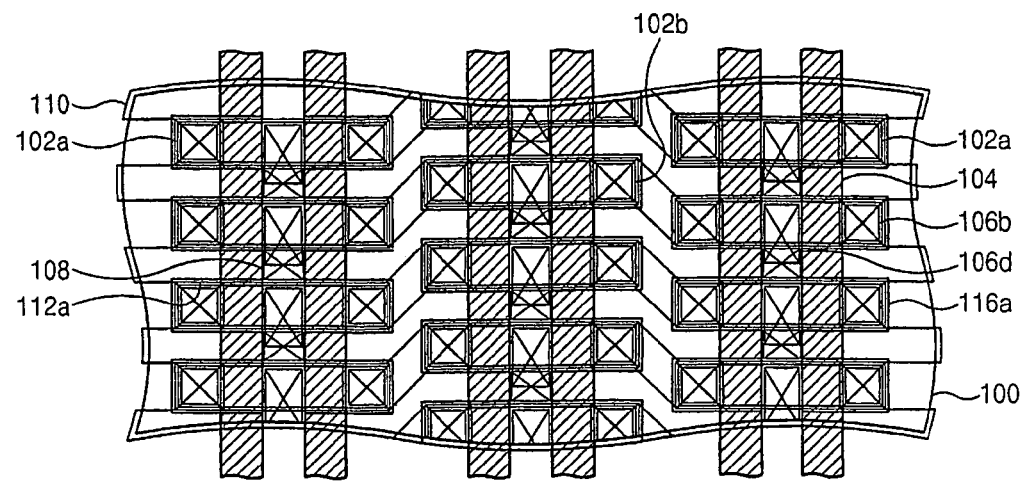

FIG. 10B is a top plan view illustrating a modified version of methods according to first embodiments of the present invention. In this modified embodiment, a buffer electrode 114 may be omitted. More particularly, at a step of FIG. 9, after forming storage plugs 112a without forming buffer electrodes, data storage elements 116a may be in direct contact with respective storage plugs 112a. Each data storage element 116a may partially extend over a respective wordline.

Figure 10C:
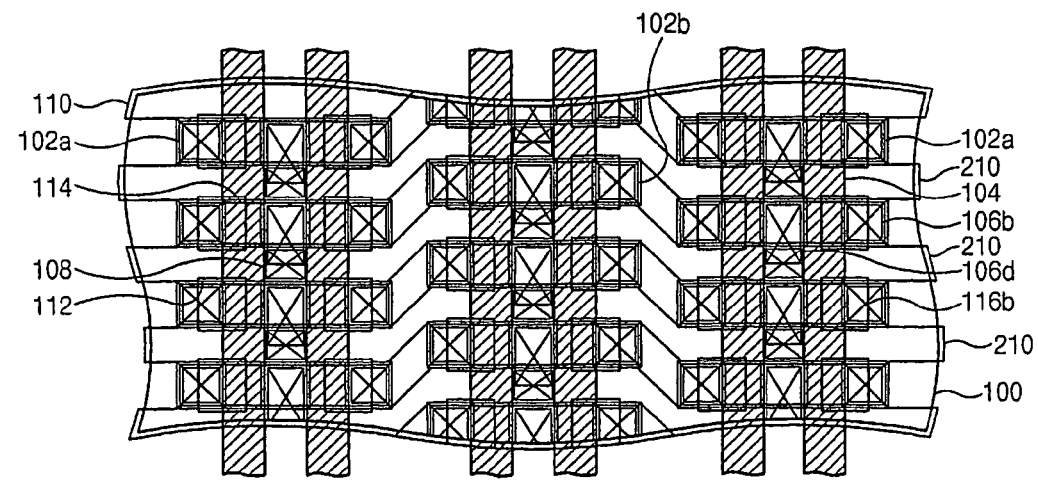

FIG. 10C is a top plan view illustrating another modified version of methods according to first embodiments of the present invention. In this modified embodiment, each data storage element 116b may have a sidewall laterally shifted from the source pad 106b to lay over the adjacent wordline 104 and an opposite sidewall to lay over an underlying active region. Such a structure may be realized using of the buffer electrode 114. Thus, a free space may be used to reduce a likelihood of a short circuit between adjacent data storage elements.

FIG. 11 through FIG. 13, FIG. 14A, FIG. 14B, and FIG. 14C are top plan views illustrating steps of a method of fabricating a semiconductor memory device according to second embodiments of the present invention.

Figure 11:
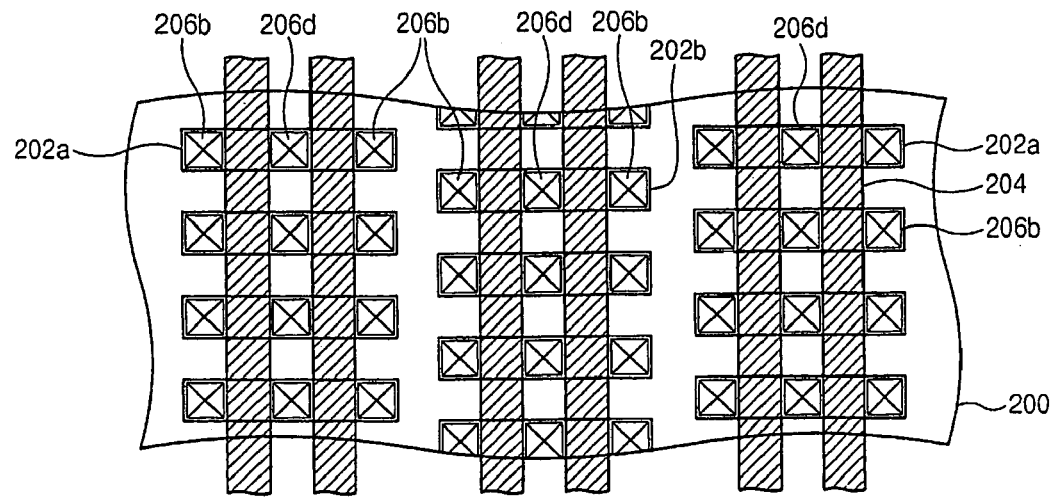
FIG. 11 through FIG. 13, FIG. 14A, FIG. 14B, and FIG. 14C are top plan views illustrating steps of fabricating a semiconductor memory device according to second embodiments of the present invention.

As illustrated in FIG. 11, first and second active regions 202a 202b and pairs of wordlines 204 may be formed as discussed above with respect to FIGS. 5-6.

At each active region, a drain pad 206d may be formed at a central portion of the active region between two wordlines 204 of the wordline pair crossing the active region, and first and second source pads 206b may be formed at first and second ends of the active region on opposite sides of the wordline pair crossing the active region. Unlike the structures illustrated in FIG. 7, the drain pads 206d do not extend beyond the respective active regions in one direction over the isolation region but are instead confined over the respective active regions. The drain pads 206d and the source pads 206b may be formed by forming a first interlayer dielectric covering the substrate including the wordlines and applying a self-aligned contact (SAC) process.

Figure 12:
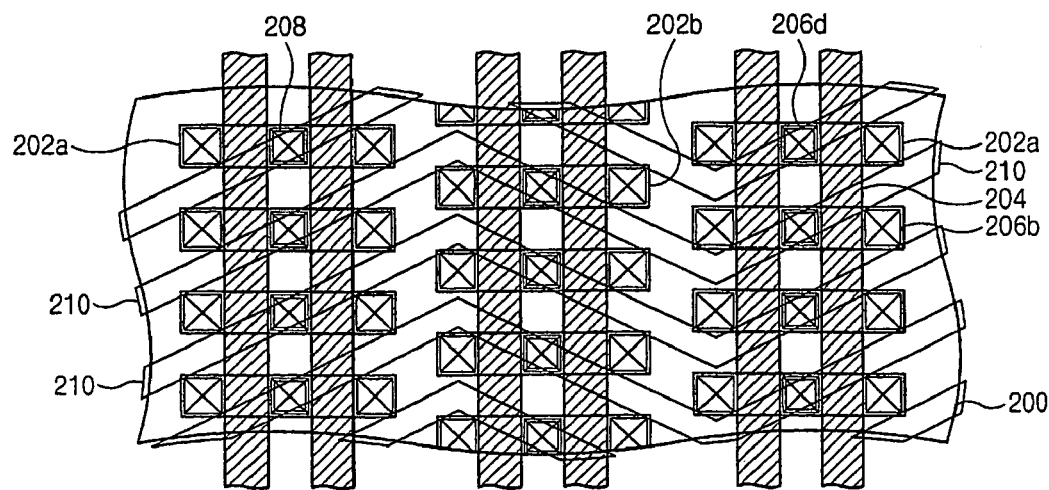

As illustrated in FIG. 12, each bitline 210 may be formed crossing over the wordlines 204 to be alternately connected to first and second active regions 202a and 202b. The bitlines 210 may be provided in a zigzag pattern to diagonally cross first active regions 202a in one direction and to diagonally cross second active regions 202b in another direction. Each bitline 210 is connected to respective first and second active regions 202a and 202b that are ½ pitch spaced (e.g., offset) from each other in the minor axis direction. The bitlines 210 may be connected to respective drain pads 206d through bitline plugs 208. For this reason, bitlines connected to a bitline plugs 208 may be formed after forming a second interlayer dielectric on an entire surface of the substrate including the source pads 206b and the drain pads 206d are formed and forming the bitline plugs 208 connected to the drain pads 206d through the second interlayer dielectric. Alternatively, a dual damascene process may be used to form contact holes exposing the drain pads 206d simultaneously with forming bitline grooves. Then, the contact holes and the bitline grooves are filled with a conductive material to provide bitlines to be in direct contact with respective drain pads.

Figure 13:
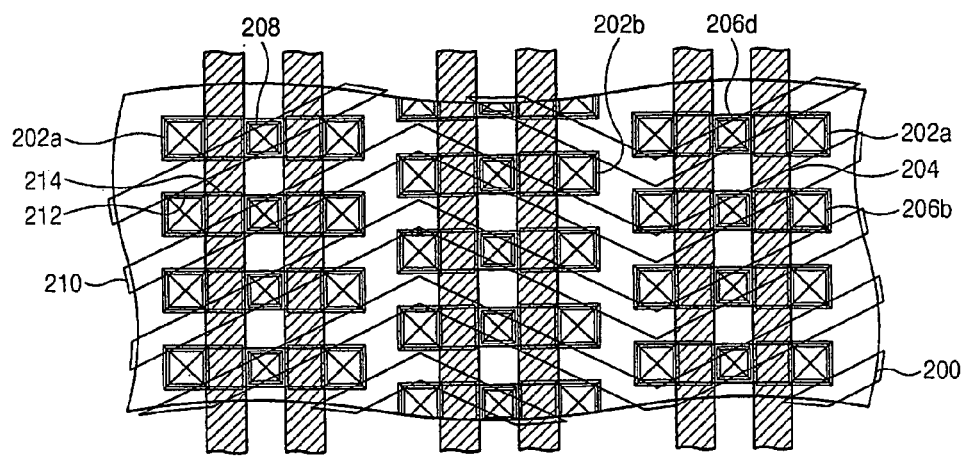

As illustrated in FIG. 13, buffer electrodes 214 may be formed connected to respective source pads 206b through storage plugs 212. The buffer electrodes 214 may serve to provide space between data storage elements connected to adjacent active regions and to increase an area occupied by data storage elements.

A third interlayer dielectric may be formed on an entire surface of substrate including the bitlines 210. Storage plugs 212 may be formed connected to respective source pads 206b through the third interlayer dielectric and the second interlayer dielectric. The buffer electrodes 214 may be formed on the storage plugs 212.

Figure 14A:
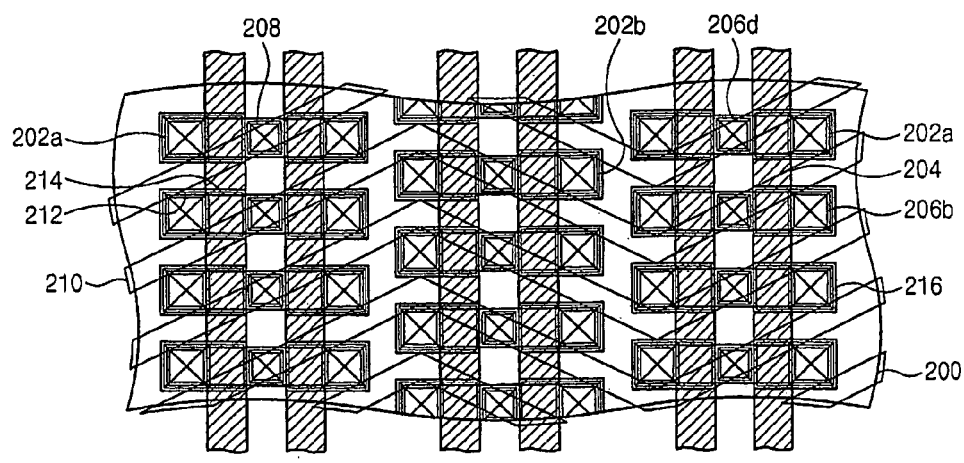

As illustrated in FIG. 14A, data storage elements 216 may be formed on respective buffer electrodes 214. The data storage elements 216 may be capacitors or resistance elements according to the type of semiconductor memory device. A method of fabricating the data storage elements 216 may vary with the type of semiconductor memory device.

Figure 14B:
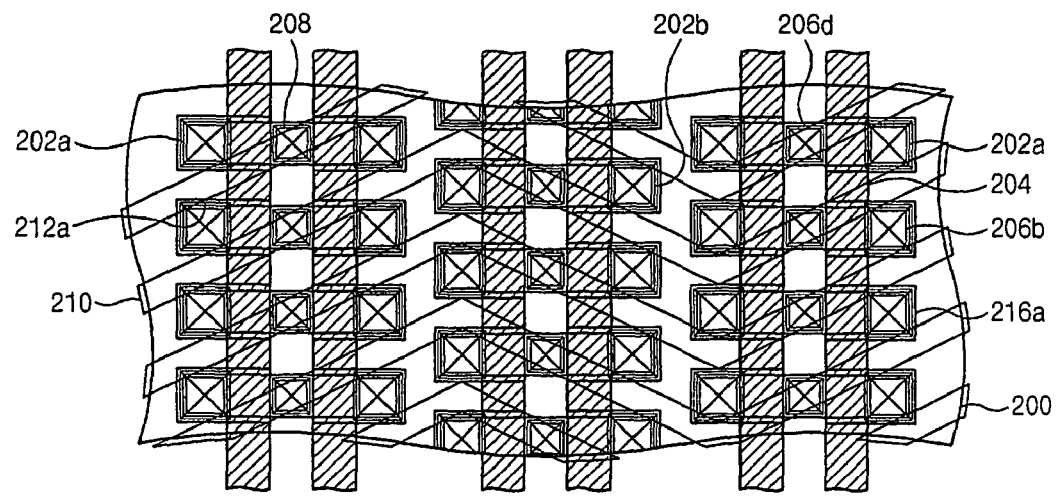

FIG. 14B is a top plan view illustrating a modified version of the method of FIGS. 11-13. In this modified embodiment, a buffer electrode 214 may be omitted. That is, at a step of FIG. 9, after forming storage plugs 212a without forming buffer electrodes, data storage elements 216a may be in direct contact with respective storage plugs 212a. The data storage elements 216a may extend partially over the wordline.

Figure 14C:
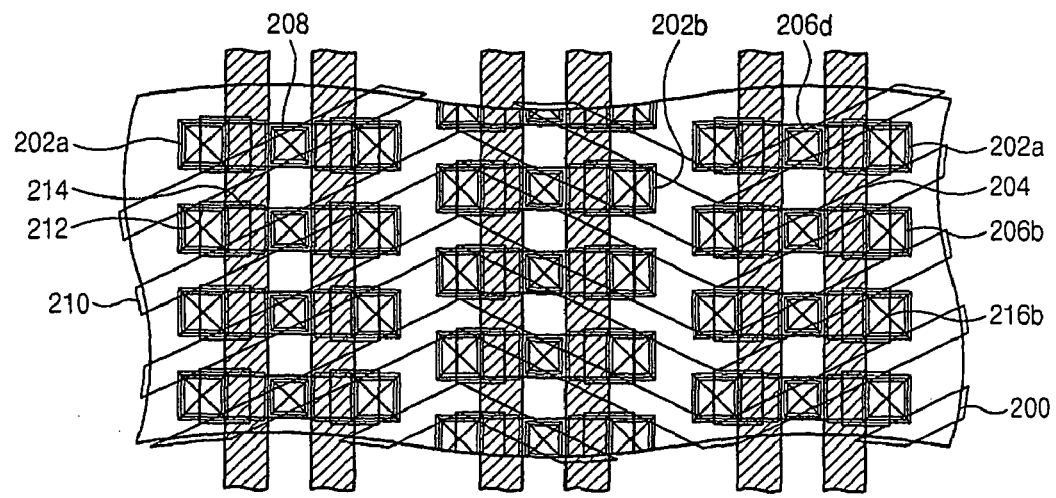

FIG. 14C is a top plan view illustrating another modified version of the method of FIGS. 11-13. This modified embodiment may be applied to provide space between data storage elements connected to adjacent first and second active regions 202a and 202b rather than to increase an area occupied by the data storage elements 216. Each data storage element 216b may have a sidewall that is laterally shifted with respect to the source pad 206b so that a portion of the data storage element extends over an adjacent wordline 204 and an opposite sidewall laid over an underlying active region. Such a structure may be realized using the buffer electrodes 114. Thus, a free space may be used to reduce a likelihood of a short between adjacent data storage elements.

Figure 15A:
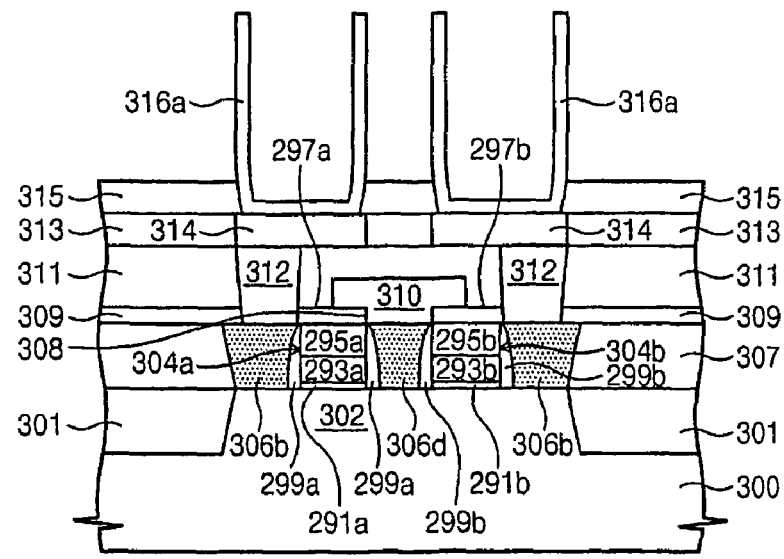
FIG. 15A, FIG. 15B, and FIG. 15C are cross-sectional views of a semiconductor memory device according to some additional embodiments of the present invention.
Figure 15B:
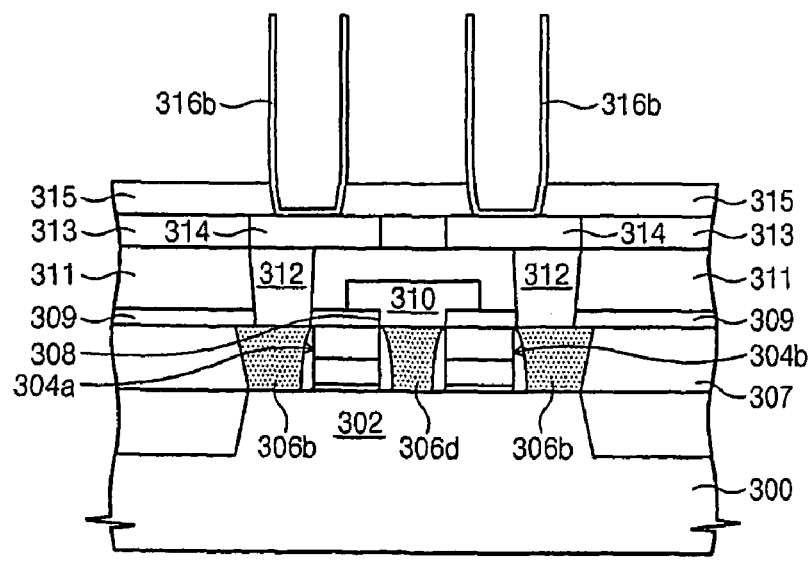
Figure 15C:
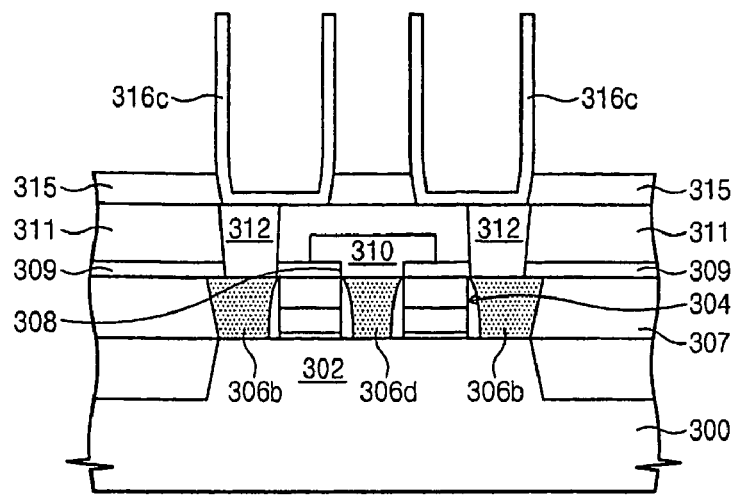

FIG. 15A, FIG. 15B, and FIG. 15C are cross-sectional views illustrating a semiconductor memory device according to embodiments of the present invention. While a DRAM cell having a cylindrical storage node is described by way of example, embodiments of the present invention may be applied to semiconductor memory devices including memory cells having other switching and/or other data storage elements.

As illustrated in FIG. 15A, device isolation layers 301 may be formed on a substrate 300 to define active regions 302. A wordline pair including two wordlines 304a and 304b crosses over the active region 302. As shown, each wordline 304a-b may include respective conductive layers 293a-b and 295a-b and respective insulating capping layers 297a-b. In addition, insulating spacers 299a-b may be provided on sidewalls of the respective wordlines 304a-b. Moreover, gate insulating layers 291a-b may be provided between the respective wordlines 304a-b and the active region 302.

A first planar interlayer dielectric 307 may be formed on the structure including the wordline pair. The first interlayer dielectric 307 may be patterned to provide self-aligned contact holes 308 between and on opposite sides of the wordlines 304a-b thereby exposing source and drain regions 306b and 306d. The contact holes may be filled with a conductive layer to form source pads 306b and a drain pad 306d. A second interlayer dielectric 309 may be formed on the structure including the source pad 306b and the drain pad 306d. A bitline 310 is connected to the drain pad 306d through the second interlayer dielectric 309. A third interlayer dielectric 311 may be formed on the structure including the bitline 310. Storage plugs 312 may be connected to respective source pads 306 through the third interlayer dielectric 311 and the second interlayer dielectric 309.

Buffer electrodes 314 may be provided on respective storage plugs 312. The buffer electrodes 314 may each extend partially over the adjacent wordlines 304a-b. In other words, the wordlines 304a-b may be between portions of respective buffer electrodes and the substrate in a direction perpendicular to a surface of the substrate. A fourth interlayer dielectric 313 may be formed on the structure including the buffer electrodes 314. Storage electrode 316a may be formed on respective buffer electrodes 314. Lower portions of storage electrodes 316a may be supported by a support layer 315.

In FIG. 15A, the storage electrodes 316a may extend over respective wordlines 304a-b. That is, a surface area of the substrate occupied by a storage electrode may extend beyond a surface area of the substrate occupied by the respective source region 306b and over a surface area of the substrate occupied by the adjacent wordline that is otherwise unused, while maintaining a spacing with respect to storage electrodes formed at another active region to increase a surface area of the storage electrodes. Alternately, storage electrodes 316b may be shifted toward the center of an active region without increasing an area of the storage electrodes to maintain a spacing with respect to adjacent storage electrodes of adjacent active regions, as illustrated in FIG. 15B. FIG. 15C illustrates storage electrodes 316c that are in direct contact with storage plugs 312.

Figure 16A:
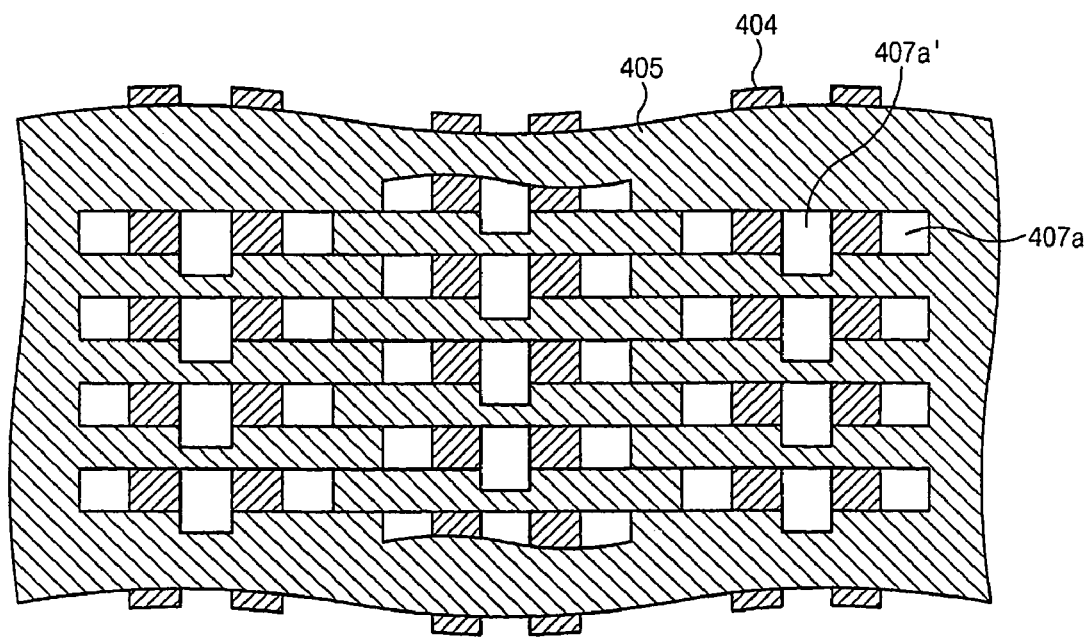
FIG. 16A through FIG. 16C illustrate pad masks for semiconductor memory devices according to methods of first embodiments of the present invention, respectively.
Figure 16B:
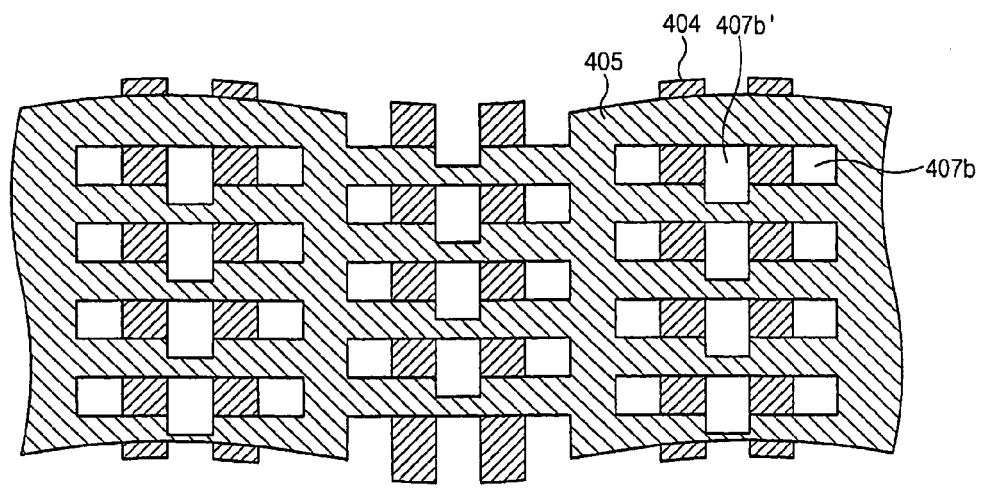
Figure 16C:
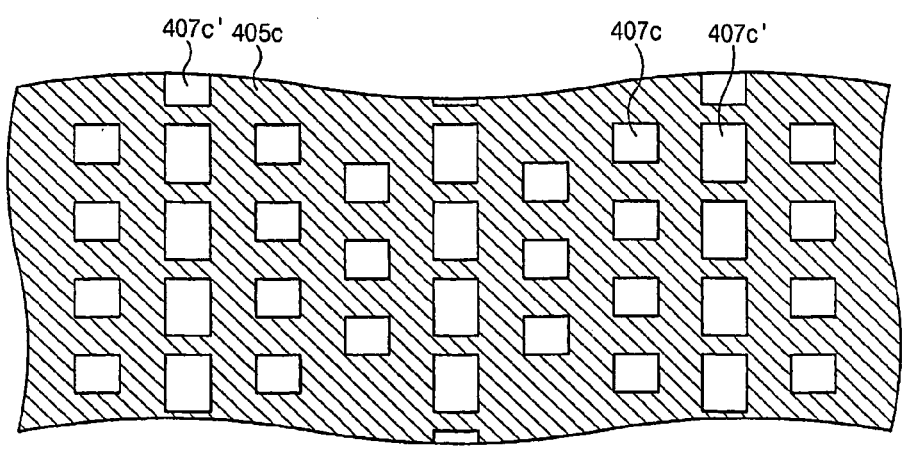

FIG. 16A through FIG. 16C illustrate pad masks of semiconductor memory devices according to the first embodiments of the present invention.

As illustrated in FIG. 16A, a mask 405a used to form drain pads and source pads may have wordlines 404 and openings 407a and 407a'. The wordlines 404 include bar-shaped (e.g., rectangular) mask areas corresponding to wordline regions of the substrate. Isolation regions correspond to device isolation regions between active regions of the substrate. The openings 407a' are provided to expose portions of active regions of the substrate between wordlines.

A pad mask 405b illustrated in FIG. 16B is an inverse image of a mask for forming an active region. Since the pad mask 405b has openings 407b and 407b' formed at portions corresponding to active regions, regions between wordlines 404 and the wordlines may be exposed.

FIG. 16C illustrates a pad mask having first (relatively large) openings 470c' and second (relatively small) openings 407c at regions where a drain pads and source pads are to be formed. The first openings 407c' define contact holes for forming drain pads, and the second openings 407c define contact holes for forming source pads. The first openings 407c' and the second openings 407c may be provided partially over respective wordlines.

Using various pad masks described above, drain pads and source pads of first embodiments of the present invention may be formed. Since a portion of each drain pad extends over a device isolation region, openings 407a', 407b', and 407c' of the pad masks include extended portions.

Figure 17A:
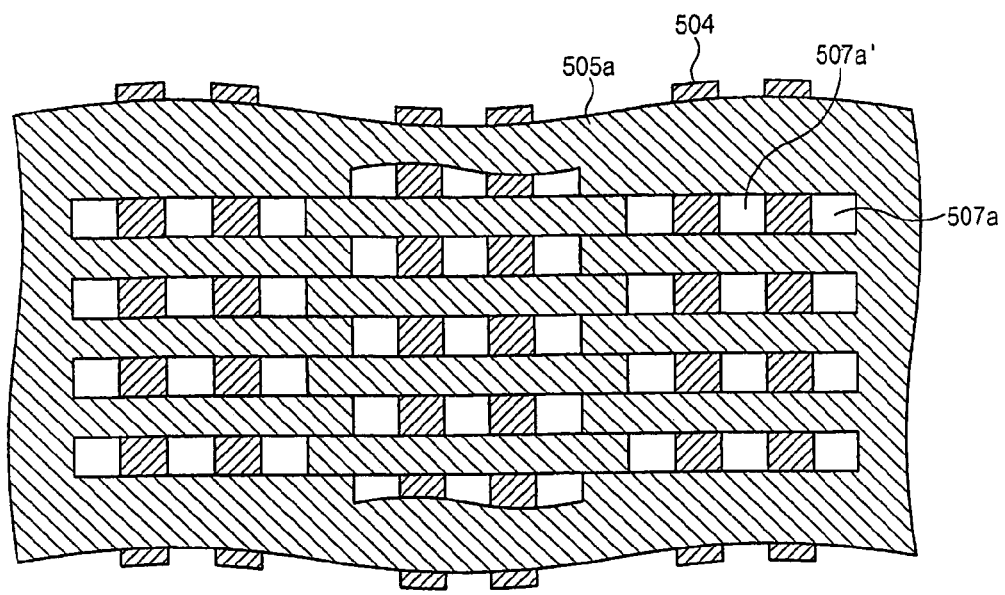
FIG. 17A through FIG. 17C illustrate pad masks for semiconductor memory devices according to methods of second embodiments of the present invention, respectively.
Figure 17B:
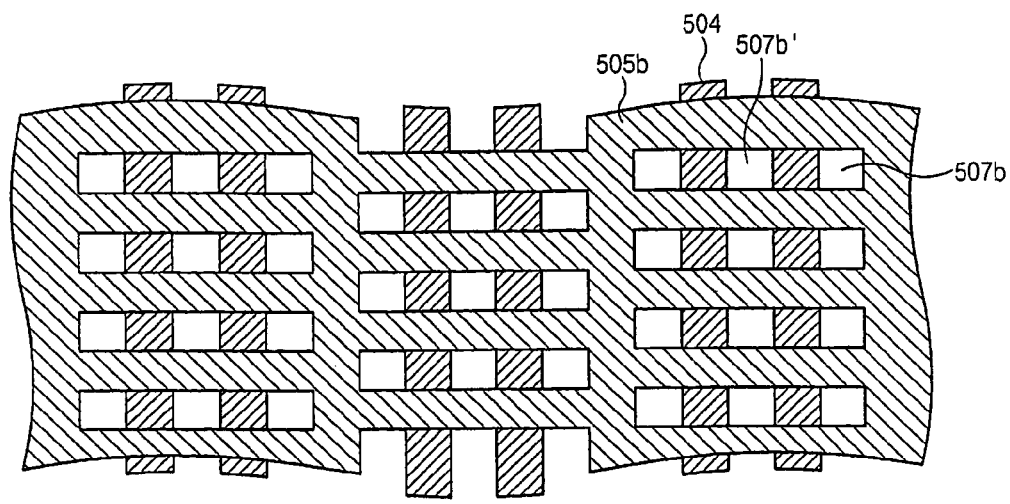
Figure 17C:
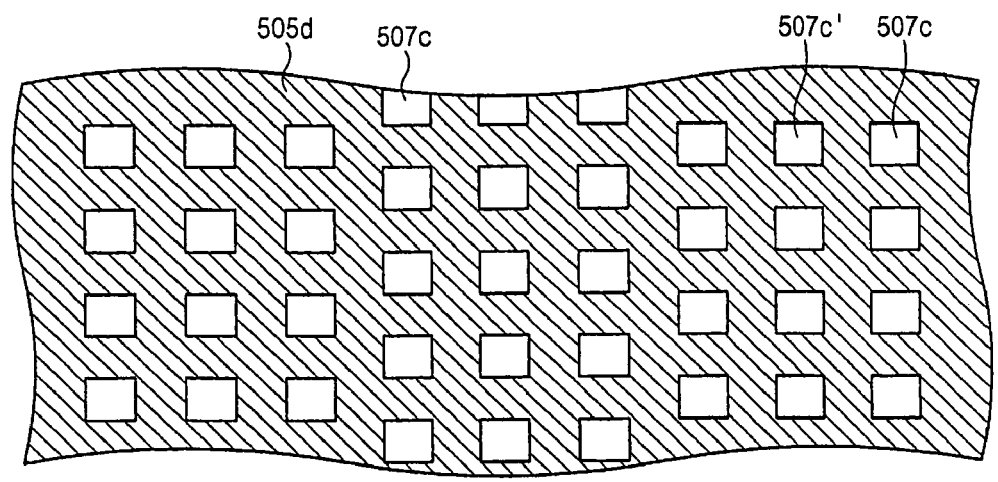

FIG. 17A through FIG. 17C illustrate pad masks for semiconductor memory devices according to second embodiments of the present invention.

Pad masks illustrated in FIG. 17A through FIG. 17C have shapes similar to shapes of the pad masks illustrated in FIG. 16A through FIG. 16C, respectively. Unlike the pad masks of FIGS. 16A through 16C, however, the pad masks of FIGS. 17A through 17C do not have extended portions for the drain pads. Locations of wordlines 504 and openings 507a', 507b', and 507c' of FIGS. 17A through 17C are identical to those of wordlines and openings of FIGS. 16A through 16C.

Advantages of semiconductor memory devices according to embodiments of the present invention may include reduced writing time, increased pattern correcting margin, and/or reduced bridging between memory storage elements of different active regions along a major axis direction.

Although the invention has been described with reference to the particular embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A semiconductor memory device comprising:
a semiconductor substrate including a plurality of active regions wherein each active region has a length in a direction of a first axis and a width in a direction of a second axis, wherein the length is greater than the width, wherein the plurality of active regions are provided in a plurality of columns in the direction of the second axis;
a field isolation layer on the semiconductor substrate surrounding each of the active regions so that field isolation layer separates and provides electrical isolation between each of the active regions in a same column and so that the field isolation layer separates and provides electrical isolation between active regions in adjacent columns;
a plurality of wordline pairs on the substrate, wherein each wordline pair crosses active regions of a respective column of active regions to define a drain portion of each of the active regions between wordlines of the respective wordline pair, and to define source portions at opposite ends of each of the active regions;
a plurality of bitlines on the substrate crossing the plurality of wordline pairs, wherein each bitline is electrically coupled to a drain portion of a respective active region of each column, and wherein each bitline crosses drain portions of active regions of adjacent columns in different directions so that different portions of a same bitline are aligned in different directions on different active regions of adjacent columns; and
a plurality of memory storage elements, wherein each memory storage element is electrically coupled with a respective one of the source portions so each end of each of the active regions is electrically coupled to a different one of the memory storage elements.

2. A semiconductor memory device according to claim 1 wherein the different directions are non-parallel with respect to the direction of the first axis and with respect to the second axis.

3. A semiconductor memory device according to claim 2 wherein active regions of adjacent columns are offset in the direction of the second axis, and wherein each of the plurality of bitlines completely crosses a respective one of the active regions extending linearly from a first side of the respective active region over the drain portion of the respective active region to a second side of the respective active region opposite the first side without changing direction.

4. A semiconductor memory device according to claim 3 wherein adjacent active regions in a column are separated in the direction of the second axis by a distance of about the width of an active region.

5. A semiconductor memory device according to claim 4 wherein active regions of adjacent columns are offset in the direction of the second axis by a distance of about the width of an active region.

6. A semiconductor memory device according to claim 3 wherein active regions of adjacent columns are offset in the direction of the second axis by a distance of at least about half the width of an active region.

7. A semiconductor memory device according to claim 3 wherein active regions of adjacent columns are offset in the direction of the second axis by a distance less than twice the width of an active region.

8. A semiconductor memory device according to claim 1 wherein each of the plurality of active regions is substantially rectangular.

9. A semiconductor memory device according to claim 1 wherein the length of an active region is about five times greater than the width of an active region.

10. A semiconductor memory device according to claim 1 wherein each wordline of the plurality of wordline pairs has a width equal to about the width of an active region.

11. A semiconductor memory device according to claim 1 wherein wordlines of a wordline pair are separated by a distance equal to about the width of an active region.

12. A semiconductor memory device according to claim 1 wherein each wordline is between a portion of an adjacent memory storage element and a respective active region in a direction perpendicular to a surface of the substrate.

13. A semiconductor memory device according to claim 1 wherein memory storage elements of adjacent active regions in a column are spaced apart by at least about the width of an active region.

14. A semiconductor memory device according to claim 1 wherein each of the memory storage elements comprises a memory storage capacitor.

15. A semiconductor memory device according to claim 14 wherein each of the memory storage capacitors comprises a ferroelectric memory storage capacitor and/or a dynamic memory storage capacitor.

16. A semiconductor memory device according to claim 1 wherein each of the memory storage elements comprises a resistance memory storage element.

17. A semiconductor memory device according to claim 16 wherein each of the resistance memory storage elements comprises a phase transition memory storage element and/or a magnetic tunneling junction memory storage element.

18. A semiconductor memory device according to claim 3 wherein each bitline is between a portion of an adjacent memory storage element and a respective active region in a direction perpendicular to a surface of the substrate.

19. A semiconductor memory device according to claim 18 wherein the memory storage element comprises at least one of a memory storage capacitor and/or a resistance memory storage element.

* * * * *